United States Patent
Tsai et al.

(10) Patent No.: US 9,783,409 B2
(45) Date of Patent: Oct. 10, 2017

(54) MICRO-ELECTRO-MECHANICAL SYSTEM DEVICE AND MICRO-ELECTRO-MECHANICAL SYSTEM COMPENSATION STRUCTURE

(71) Applicants: Ming-Han Tsai, Hsin-Chu (TW); Chih-Ming Sun, Hsin-Chu (TW); Hsin-Hui Hsu, Hsin-Chu (TW)

(72) Inventors: Ming-Han Tsai, Hsin-Chu (TW); Chih-Ming Sun, Hsin-Chu (TW); Hsin-Hui Hsu, Hsin-Chu (TW)

(73) Assignee: PIXART IMAGING INCORPORATION, Hsinchu (TW)

( * ) Notice: Subject to any disclaimer, the term of this patent is extended or adjusted under 35 U.S.C. 154(b) by 305 days.

(21) Appl. No.: 14/499,200

(22) Filed: Sep. 28, 2014

(65) Prior Publication Data
US 2015/0097586 A1    Apr. 9, 2015

(30) Foreign Application Priority Data
Oct. 3, 2013    (TW) .............................. 102135819 A

(51) Int. Cl.
*G01R 27/26* (2006.01)
*B81B 3/00* (2006.01)

(52) U.S. Cl.
CPC .................. *B81B 3/0086* (2013.01)

(58) Field of Classification Search
CPC ..... G01R 11/36; G01R 27/12; H01L 2924/14; H01L 28/40
USPC .......... 324/686, 684, 500, 600, 200, 207.12, 324/754.11, 219–242, 750.17, 754.28, 324/658, 76.66; 438/48–53; 257/414–417
See application file for complete search history.

(56) References Cited

U.S. PATENT DOCUMENTS

| | | | |
|---|---|---|---|
| 8,852,984 B1 * | 10/2014 | Quevy | B81B 3/0062 438/48 |
| 2005/0066728 A1 | 3/2005 | Chojnacki et al. | |
| 2006/0230830 A1 * | 10/2006 | Geen | G01C 19/574 73/514.29 |
| 2010/0212425 A1 * | 8/2010 | Hsu | G01P 15/0802 73/514.32 |
| 2012/0091854 A1 * | 4/2012 | Kaajakari | H02N 1/008 310/309 |
| 2013/0192371 A1 * | 8/2013 | Rytkonen | G01P 15/02 73/514.32 |

* cited by examiner

*Primary Examiner* — Melissa Koval
*Assistant Examiner* — Trung Nguyen
(74) *Attorney, Agent, or Firm* — Tung & Associates

(57) ABSTRACT

This invention provides a MEMS device, including: a mass structure having at least one anchor; at least one flexible structure connected with the mass structure at the at least one anchor; a plurality of top electrodes located above the mass structure and forming a top capacitor circuit with the mass structure; and a plurality of bottom electrodes located under the mass structure and forming a bottom capacitor circuit with the mass structure. The projections of the plural top electrodes on the mass structure along a normal direction of the mass structure are located at opposite sides of the anchor, and the projections of the plural bottom electrodes on the mass structure along a normal direction of the mass structure are located at opposite sides of the anchor. This invention also provides a MEMS compensation structure.

9 Claims, 5 Drawing Sheets

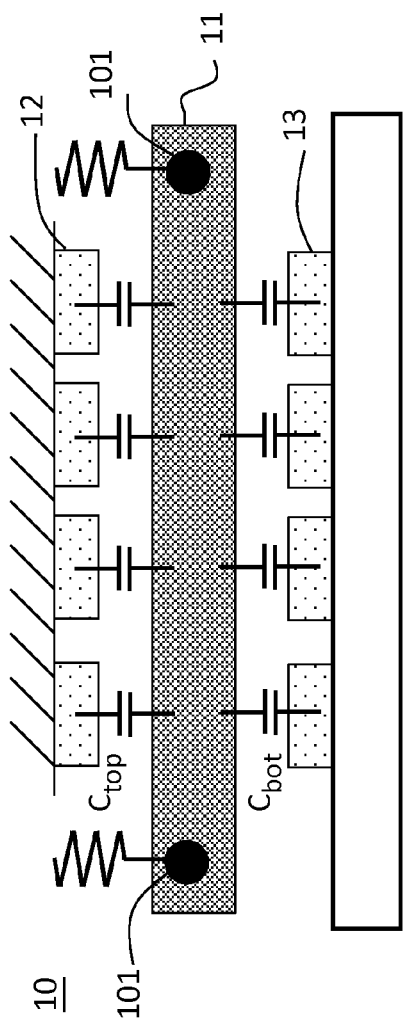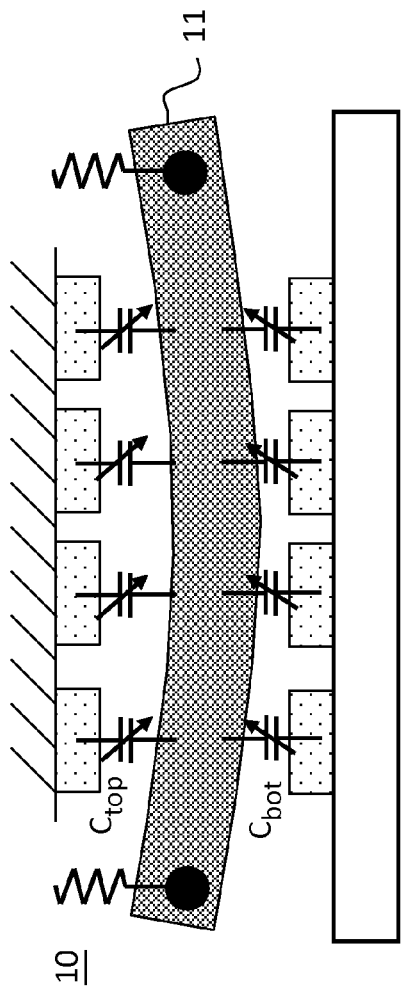
Fig. 1A (Prior art)
Fig. 1B (Prior art)

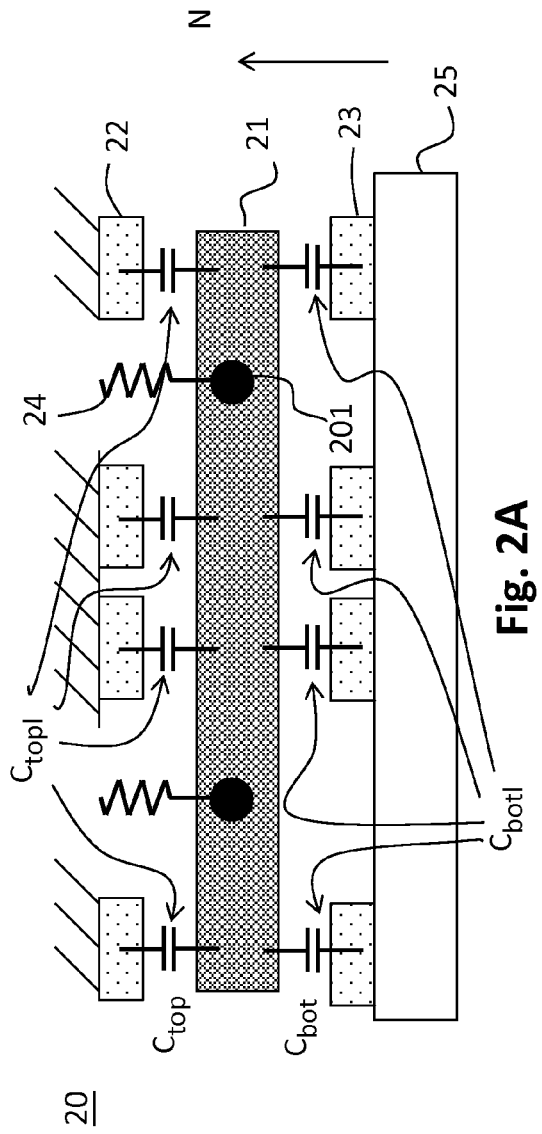
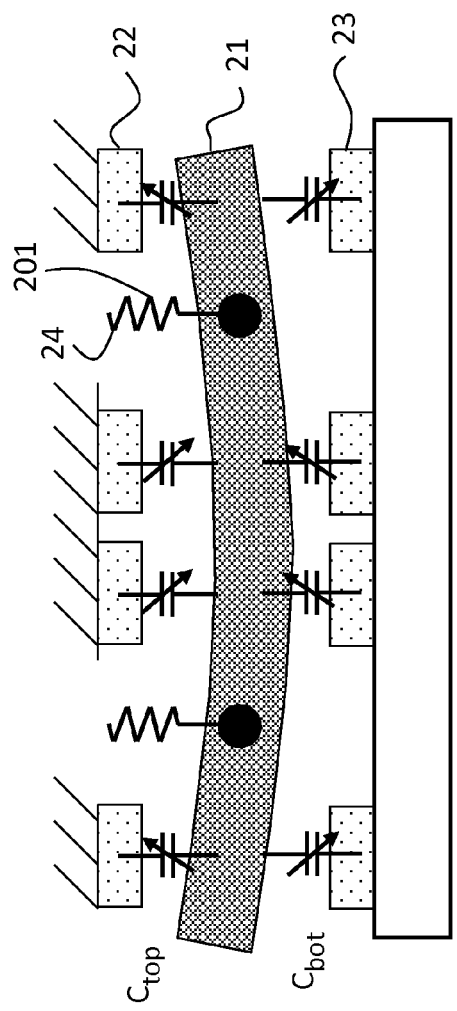
Fig. 2A
Fig. 2B

MICRO-ELECTRO-MECHANICAL SYSTEM DEVICE AND MICRO-ELECTRO-MECHANICAL SYSTEM COMPENSATION STRUCTURE

CROSS REFERENCE

The present invention claims priority to TW 102135819, filed on Oct. 3, 2013.

BACKGROUND OF THE INVENTION

Field of Invention

The present invention relates to a micro-electro-mechanical system (MEMS) device, especially a MEMS device capable of compensating a deformation of a mass structure and a MEMS compensation structure thereof.

Description of Related Art

Typically, a MEMS device is designed to sense a change of a capacitance generated by a movement of a mass structure therein. FIG. 1A shows a prior art MEMS device 10, wherein a mass structure 11 is connected to springs by anchors 101 located at peripheral sides of the mass structure 11, and the mass structure 11 forms a top capacitor circuit Ctop with a top electrode 12 and a bottom capacitor circuit Cbot with a bottom electrode 13 respectively. When the mass structure 11 moves relatively with respect to the top electrode 12 and the bottom electrode 13, the movement can be sensed according to the capacitance changes of the top capacitor circuit Ctop and the bottom capacitor circuit Cbot.

However, when the MEMS device 10 works under high temperature, the mass structure 11 may deform due to thermal expansion. Referring to FIG. 1B, as an example, the center of the mass structure 11 is deformed downward due to thermal expansion, which causes a decrease of the capacitance of the top capacitor circuit Ctop and an increase of the capacitance of the bottom capacitor circuit Cbot (as indicated by the directions of the arrows), and therefore the sensing result is inaccurate. The mass structure may deform not only because of thermal expansion but because of other reasons such as stress caused by a manufacturing step.

In view of the drawback of the prior art, the present invention provides a MEMS device having a compensation mass structure. The MEMS device includes a plurality of top electrodes, a plurality of bottom electrodes, and a mass structure having plural anchors. The projections of the plural top electrodes on the mass structure along a normal direction of the mass structure are located at opposite sides of each anchor, and the projections of the plural bottom electrodes on the mass structure along a normal direction of the mass structure are similarly located at opposite sides of each anchor, such that the deformation of the mass structure does not affect the sensing result. The present invention also provides a compensation mass structure corresponding to the MEMS device.

SUMMARY OF THE INVENTION

In one perspective, the present invention discloses a MEMS device, which includes: a mass structure having at least one anchor; at least one flexible structure connected with the mass structure at the at least one anchor; a plurality of top electrodes located above the mass structure and forming a top capacitor circuit with the mass structure; and a plurality of bottom electrodes located under the mass structure and forming a bottom capacitor circuit with the mass structure, wherein projections of the top electrodes on the mass structure along a normal direction of the mass structure are located at opposite sides of the anchor, and projections of the bottom electrodes on the mass structure along a normal direction of the mass structure are located at opposite sides of the anchor.

In one embodiment, the MEMS device includes a plurality of anchors and a plurality of flexible structures, wherein the projections of the top electrodes on the mass structure along the normal direction of the mass structure are located at opposite sides of each anchor, and the projections of the bottom electrodes on the mass structure along the normal direction of the mass structure are located at opposite sides of each anchor.

In one embodiment, the top capacitor circuit comprises a plurality of local top capacitors each of which is formed by the mass structure and one of the top electrodes; when the mass structure is deformed, a portion of the local top capacitors increase their capacitances because of the deformation of the mass structure, and another portion of the local top capacitors decrease their capacitances because of the deformation of the mass structure.

In one embodiment, the bottom capacitor circuit comprises a plurality of local bottom capacitors each of which is formed by the mass structure and one of the bottom electrodes; when the mass structure is deformed, a portion of the local bottom capacitors increase their capacitances because of the deformation of the mass structure, and another portion of the local bottom capacitors decrease their capacitances because of the deformation of the mass structure.

In one embodiment, the MEMS device further includes: a compensation mass structure; a plurality of top compensation electrodes, located above the compensation mass structure and forming a top compensation capacitor circuit with the compensation mass structure, wherein the top compensation electrodes are coupled to the bottom electrodes; and a plurality of bottom compensation electrodes, located under the compensation mass structure and forming a bottom compensation capacitor circuit with the compensation mass structure, wherein the bottom compensation electrodes are coupled to the top electrodes.

In one embodiment, the compensation mass structure is fixed and does not move relatively with respect to the top compensation electrodes and the bottom compensation electrodes.

In one embodiment, the compensation mass structure and the mass structure are connected to a same voltage level; the top compensation electrodes and the bottom electrodes are connected to another same voltage level; and the bottom compensation electrodes and the top electrodes are connected to yet another same voltage level, whereby the top capacitor and the bottom compensation capacitor form a parallel capacitor circuit, and the bottom capacitor and the top compensation capacitor form another parallel capacitor circuit.

In another perspective of the present invention, a MEMS compensation structure is provided which is for in a MEMS device which includes a top capacitor circuit located at an upper elevation level along a vertical direction and a bottom capacitor circuit located at a lower elevation level along the vertical direction. The MEMS compensation structure includes: a compensation mass structure; a plurality of top compensation electrodes, forming a top compensation capacitor circuit with the compensation mass structure, wherein the top compensation capacitor circuit and the bottom capacitor circuit are connected in parallel; and a plurality of bottom compensation electrodes, forming a bottom compensation capacitor circuit with the compensation mass structure, wherein the bottom compensation capacitor circuit and the top capacitor circuit are connected in parallel.

In one embodiment, the compensation mass structure is fixed and does not move relatively with respect to the top compensation electrodes and the bottom compensation electrodes.

In one embodiment, the top capacitor circuit is formed by a mass structure and a plurality of top electrodes, and the bottom capacitor circuit is formed by the mass structure and a plurality of bottom electrodes, wherein the numbers of the top compensation electrodes and the top electrodes are the same, and the numbers of the bottom compensation electrodes and the bottom electrodes are same; and wherein the sizes and layouts of the top compensation electrodes and the top electrodes are substantially same, and the sizes and layouts of the bottom compensation electrodes and the bottom electrodes are substantially same.

The objectives, technical details, features, and effects of the present invention will be better understood with regard to the detailed description of the embodiments below, with reference to the drawings.

BRIEF DESCRIPTION OF THE DRAWINGS

FIGS. 1A and 1B show a prior art MEMS device.
FIGS. 2A and 2B show a MEMS device according to an embodiment of the present invention.

DESCRIPTION OF THE PREFERRED EMBODIMENTS

Figure 3:
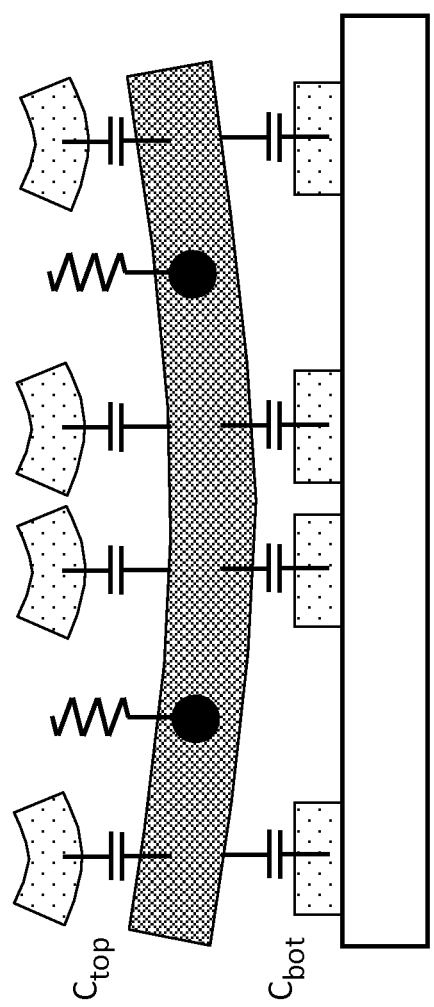
FIG. 3 shows the deformation status of the top electrodes.

The drawings as referred to throughout the description of the present invention are for illustrative purpose only, to show the interrelations between the regions and components, but not drawn according to actual scale. The orientation wordings in the description such as: above, under, left, or right are for reference with respect to the drawings, but not for limiting the actual product made according to the present invention.

Please refer to FIGS. 2A and 2B. FIG. 2A shows a MEMS device 20 according to an embodiment of the present invention. The MEMS device 20 includes a mass structure 21, a plurality of top electrodes 22, a plurality of bottom electrodes 23, and at least one flexible structure 24; the above-mentioned components can be disposed on a substrate 25, and each flexible structure 24 for example is a spring whereby the mass structure 21 to move relatively with respect to the top electrodes 22 and the bottom electrodes 23. FIG. 2B shows that the mass structure 21 of FIG. 2A is deformed because of stress caused by thermal expansion or other reasons. The mass structure 21 includes at least one anchor 201 in correspondence with the flexible structure 24, to connect a corresponding flexible structure 24. In the embodiment shown in the figure, there are two flexible structures 24 and two anchors 201; however, this is only an example and the numbers of the flexible structure (s) 24 and the anchor(s) 201 can be any other numbers. In a preferable embodiment, the numbers of the flexible structures 24 and the anchors 201 are plural. The mass structure 21 forms a top capacitor circuit Ctop with the top electrodes 22 and forms a bottom capacitor circuit Cbot with the bottom electrodes 23, wherein the projections of the plural top electrodes 22 on the mass structure 21 along a normal direction of the mass structure 21 are located at opposite sides of the anchor 201, and the projections of the plural bottom electrodes 23 on the mass structure 21 along a normal direction of the mass structure 21 are also located at opposite sides of the anchor 201.

From another perspective, according to the present invention, the MEMS device 20 is designed as thus. The top capacitor circuit Ctop includes a plurality of local top capacitors Ctopl, i.e., each top electrode 22 forms one of the local top capacitors Ctopl with the mass structure 21, and the bottom capacitor circuit Cbot includes a plurality of local bottom capacitors Cbotl, i.e., each bottom electrode 23 forms one of the local bottom capacitors Cbotl with the mass structure 21. In FIGS. 2A and 2B, at the left side of every anchor 201, the mass structure 21 forms at least one local top capacitor Ctopl with at least one top electrode 22 above the mass structure 21, and at the right side of every anchor 201, the mass structure 21 also forms at least one local top capacitor Ctopl with at least one top electrode 22 above the mass structure 21. Similarly, at the left side of every anchor 201, the mass structure 21 forms at least one local bottom capacitor Cbotl with at least one bottom electrode 23 under the mass structure, and at the right side of every anchor 201, the mass structure 21 forms at least one local bottom capacitor Cbotl with at least one bottom electrode 23 under the mass structure 21. This is different from the prior art shown in FIGS. 1A and 1B which provides the top capacitor Ctop and bottom capacitor Cbot only at a single side of every anchor 201. Such difference provides an important benefit which is explained below:

Referring to FIG. 2B, the mass structure 21 is deformed (because of thermal expansion or other reasons such as stress), and therefore, the distances between the top electrodes 22 and the mass structure 21 change. In the region between the anchors 201, the distances increase (thus the capacitances of the local top capacitors Ctopl decrease). In the region outside the anchors 201, the distances decrease (thus the capacitances of the local top capacitors Ctopl increase). However, because the local top capacitors are located at opposite sides of the anchors 201, the capacitance deviations counterbalance one the other such that the remaining effect of the deformation on the sensing result is greatly reduced. Similarly, the local bottom capacitors Cbotl are located at opposite sides of the anchors 201, so the capacitance deviations can counterbalance one the other such that the sensing error is greatly reduced. In contrast, in the prior art shown in FIGS. 1A and 1B, the capacitance deviation caused by the deformation of the mass structure 21 cannot be cancelled, and it produces a significant sensing error. Therefore, the present invention is superior to the prior art.

For illustrative purpose, the mass structure 21 of FIG. 2B is shown to have an upward warpage (its center deforms downwardly); however, it can be readily understood that the present invention can provide a similar effect to reduce the sensing error when the mass structure 21 has a downward warpage.

In one embodiment, the MEMS device can be designed such that when it is at a reference temperature which can be a standard working temperature such as a usual environment temperature or a recommended working temperature, the sum of all the capacitance increases equals the sum of all the capacitance decreases.

The aforementioned embodiment reduces the sensing error caused by the deformation of the mass structure 21. However, in some case, the top electrodes may deform, as shown in FIG. 3; such deformation can also cause the capacitance of the top capacitor circuit Ctop to change, resulting in a sensing error.

Figure 4A:
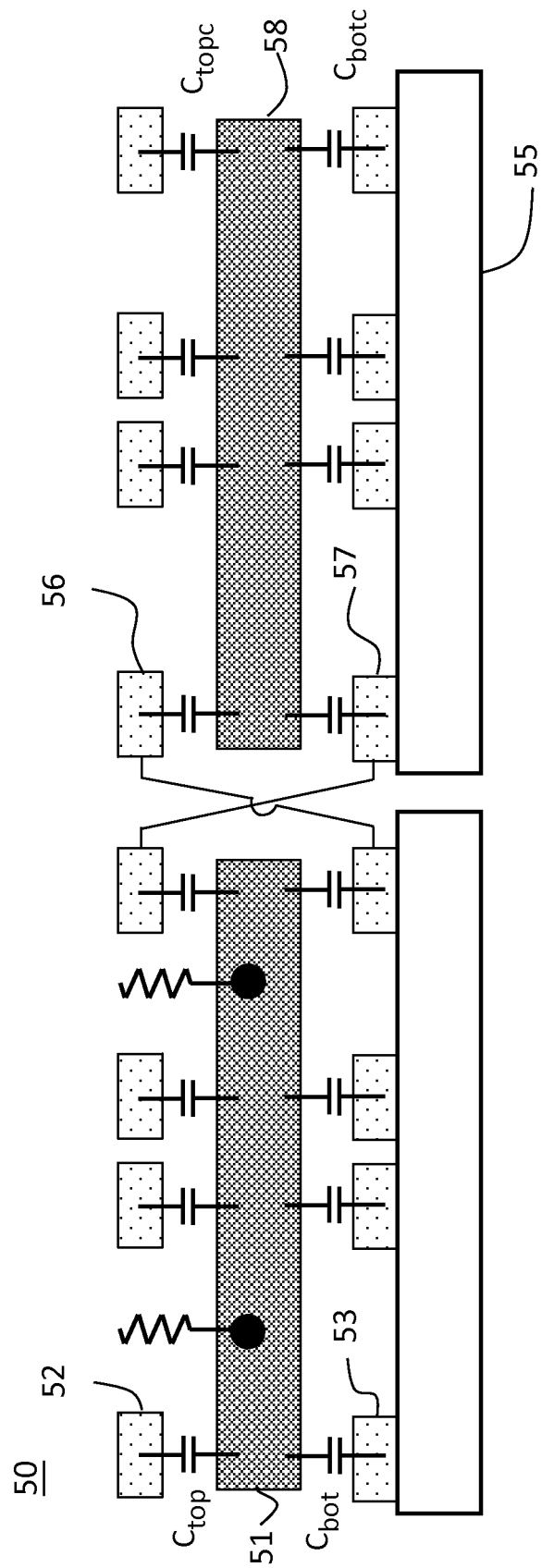
FIGS. 4A, 4B show a MEMS device according to another embodiment of the present invention, which includes a compensation structure.
Figure 4B:
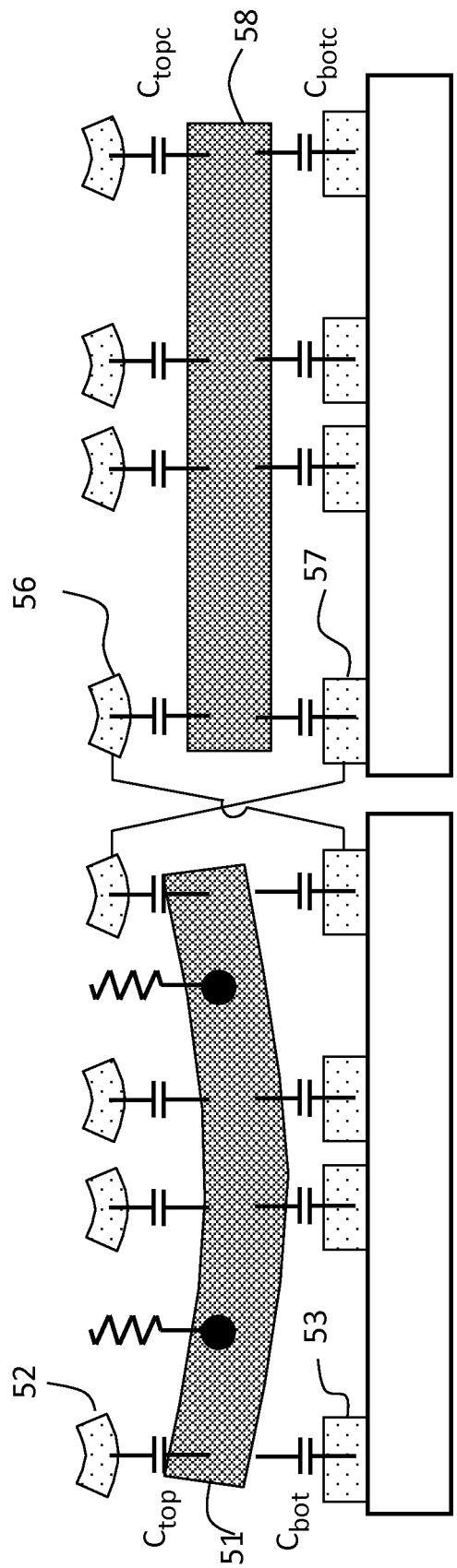

In order to solve the sensing error caused by the deformation of the top electrode, a solution is provided by the present invention as shown in FIGS. 4A and 4B. FIG. 4B shows that the MEMS device of FIG. 4A is deformed. The left side of FIG. 4A is similar to the embodiment of FIG. 2A, wherein the MEMS device 50 includes a mass structure 51, a plurality of top electrodes 52, and a plurality of bottom electrodes 53. The right side of FIG. 4A shows that the MEMS structure 50 further includes a compensation mass structure 58; a plurality of top compensation electrodes 56, located above the compensation mass structure 58 and forming a top compensation capacitor circuit Ctopc with the compensation mass structure 58, wherein the top compensation capacitor circuit Ctopc is connected in parallel with the bottom capacitor circuit Cbot; and a plurality of bottom compensation electrodes 57, located under the compensation mass structure 58 and forming a bottom compensation capacitor circuit Cbotc with the compensation mass structure 58, wherein the bottom compensation capacitor circuit Cbotc is connected in parallel with the top capacitor circuit Ctop. In a preferable embodiment, the compensation mass structure 58 and the mass structure 51 are connected to a same voltage level; the top compensation electrodes 56 and the bottom electrodes 53 are connected to another same voltage level; and the bottom compensation electrodes 57 and the top electrodes 52 are connected to yet another same voltage level, such that the top capacitor circuit Ctop and the bottom compensation capacitor circuit Cbotc form a parallel capacitor circuit, and the bottom capacitor circuit Cbot and the top compensation capacitor circuit Ctopc form another parallel capacitor circuit. The term "same voltage level" is not limited to absolutely same voltage level, but allows a certain voltage difference for example caused by wiring resistance. In one embodiment, the mass compensation structure 58 can be rigidly connected to the substrate 55, that is, the compensation mass structure 58 is fixed and does not move relatively with respect to the top compensation electrodes 56 and the bottom compensation electrodes 57.

Referring to FIG. 4B, when there is any reason which causes the top electrodes 52 to deform, the top compensation electrodes 56 also deform. Therefore, based on the differential capacitor design, the total capacitance deviations of the top capacitor circuit Ctop and the bottom compensation capacitor circuit Cbotc can counterbalance the total capacitance deviations of the bottom capacitor circuit Cbot and the top compensation capacitor circuit Ctopc, such that the sensing error can be reduced or eliminated. In this embodiment, the deformation of the top electrodes is illustrated as an example; obviously, the counterbalance effect is also capable of reducing the sensing error when there is any reason causing the bottom electrodes to deform.

In one embodiment, the number of the top compensation electrodes 56 is equal to the number of the top electrodes 52, and the number of the bottom compensation electrodes 57 is equal to the number of the bottom electrodes 53; furthermore, the sizes and layouts of the top compensation electrodes 56 and the top electrodes 52 are substantially same, and the sizes and layouts of the bottom compensation electrodes 57 and the bottom electrodes 53 are substantially same. ("Substantially the same" means that there can be minor differences due to, for example, manufacturing deviations.) However, the present invention is not limited to the aforementioned embodiment; for example, the numbers, sizes, and layouts of the top and bottom compensation electrodes can be different from the numbers, sizes, and layouts of the top and bottom electrodes, which is still within the scope of the present invention.

For illustrative purpose, the compensation structure of the MEMS device 50 as shown in FIGS. 4A and 4B is horizontally adjacent to the basic MEMS device. However, in practical implementation, the compensation structure of the MEMS device can be separated and located farther from the basic MEMS device, or rotated by an angle with respect to the basic MEMS device, or located at a different elevation with respect to the basic MEMS device, not limited to the arrangement as shown in FIGS. 4A and 4B.

Further, the compensation structure at the right side of FIGS. 4A and 4B is not necessarily used only for compensating the MEMS device of FIGS. 2A and 2B; it can be used to compensate not only the MEMS device of FIGS. 2A and 2B, but also other MEMS devices. For example, the compensation structure at the right side of FIGS. 4A and 4B can be provided to cooperate with the prior art MEMS device of FIGS. 1A and 1B, such that the top capacitor Ctop (FIGS. 1A and 1B) and the corresponding bottom compensation capacitor circuit form a parallel capacitor circuit, and the bottom capacitor circuit Cbot (FIGS. 1A and 1B) and the corresponding top compensation capacitor circuit form another parallel capacitor circuit.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. Therefore, all these and other modifications should fall within the scope of the present invention. An embodiment or a claim of the present invention does not need to attain or include all the objectives, advantages or features described in the above. The abstract and the title are provided for assisting searches and not to be read as limitations to the scope of the present invention.

What is claimed is:
1. A MEMS device, comprising:
   a mass structure, including at least one anchor;
   at least one flexible structure connected with the mass structure at the at least one anchor;
   a plurality of top electrodes, located above the mass structure to form a top capacitor circuit with the mass structure;
   a plurality of bottom electrodes, located under the mass structure to form a bottom capacitor circuit with the mass structure;
   a compensation mass structure;
   a plurality of top compensation electrodes, located above the compensation mass structure and forming a top compensation capacitor circuit with the compensation mass structure, wherein the top compensation electrodes are coupled to the bottom electrodes; and
   a plurality of bottom compensation electrodes, located under the compensation mass structure and forming a bottom compensation capacitor circuit with the compensation mass structure, wherein the bottom compensation electrodes are coupled to the top electrodes;
   wherein projections of the top electrodes on the mass structure along a normal direction of the mass structure are located at opposite sides of the anchor, and projections of the plural bottom electrodes on the mass structure along a normal direction of the mass structure are located at opposite sides of the anchor.

2. The MEMS device of claim 1, comprising a plurality of anchors and a plurality of flexible structures, wherein the projections of the top electrodes on the mass structure along the normal direction of the mass structure are located at opposite sides of each anchor, and the projections of the bottom electrodes on the mass structure along the normal direction of the mass structure are located at opposite sides of each anchor.

3. The MEMS device of claim 1, wherein the top capacitor circuit comprises a plurality of local top capacitors each of which is formed by the mass structure and one of the top electrodes; when the mass structure is deformed, a portion of the local top capacitors increase their capacitances because of the deformation of the mass structure, and another portion of the local top capacitors decrease their capacitances because of the deformation of the mass structure.

4. The MEMS device of claim 1, wherein the bottom capacitor circuit comprises a plurality of local bottom capacitors each of which is formed by the mass structure and one of the bottom electrodes; when the mass structure is deformed, a portion of the local top capacitors increase their capacitances because of the deformation of the mass structure, and another portion of the local top capacitors decrease their capacitances because of the deformation of the mass structure.

5. The MEMS device of claim 1, wherein the compensation mass structure is fixed and does not move relatively with respect to the top compensation electrodes and the bottom compensation electrodes.

6. The MEMS device of claim 1, wherein the compensation mass structure and the mass structure are connected to a same voltage level; the top compensation electrodes and the bottom electrodes are connected to another same voltage level; and the bottom compensation electrodes and the top electrodes are connected to yet another same voltage level, whereby the top capacitor and the bottom compensation capacitor form a parallel capacitor circuit, and the bottom capacitor and the top compensation capacitor form another parallel capacitor circuit.

7. A MEMS compensation structure for use in a MEMS device which includes a top capacitor circuit located at an upper elevation level along a vertical direction and a bottom capacitor circuit located at a lower elevation level along the vertical direction, the MEMS compensation structure comprising:
 a compensation mass structure;
 a plurality of top compensation electrodes, forming a top compensation capacitor circuit with the compensation mass structure, wherein the top compensation capacitor circuit and the bottom capacitor circuit are connected in parallel; and
 a plurality of bottom compensation electrodes, forming a bottom compensation capacitor circuit with the compensation mass structure, wherein the bottom compensation capacitor circuit and the top capacitor circuit are connected in parallel;
 wherein the top capacitor circuit is formed by a mass structure and a plurality of top electrodes, and the bottom capacitor circuit is formed by the mass structure and a plurality of bottom electrodes; wherein the numbers of the top compensation electrodes and the top electrodes are the same, and the numbers of the bottom compensation electrodes and the bottom electrodes are same; and wherein the sizes and layouts of the top compensation electrodes and the top electrodes are substantially same, and the sizes and layouts of the bottom compensation electrodes and the bottom electrodes are substantially same.

8. The MEMS compensation structure of claim 7, wherein the compensation mass structure is fixed and does not move relatively with respect to the top compensation electrodes and the bottom compensation electrodes.

9. A MEMS device, comprising:
 a mass structure, including at least one anchor;
 at least one flexible structure connected with the mass structure at the at least one anchor;
 a plurality of top electrodes, located above the mass structure to form a top capacitor circuit with the mass structure;
 a plurality of bottom electrodes, located under the mass structure to form a bottom capacitor circuit with the mass structure;
 a compensation mass structure, wherein the compensation mass structure and the mass structure are connected to a same voltage level;
 a plurality of top compensation electrodes, wherein the top compensation electrodes and the bottom electrodes are connected to another voltage level, whereby the top capacitor and the bottom compensation capacitor form a parallel capacitor circuit; and
 a plurality of bottom compensation electrodes, wherein the bottom compensation electrodes and the top electrodes are connected to yet another same voltage level, whereby the bottom capacitor and the top compensation capacitor form another parallel capacitor circuit;
 wherein projections of the top electrodes on the mass structure along a normal direction of the mass structure are located at opposite sides of the anchor, and projections of the plural bottom electrodes on the mass structure along a normal direction of the mass structure are located at opposite sides of the anchor.

* * * * *